United States Patent

Kashimura

[11] Patent Number: 6,078,797
[45] Date of Patent: Jun. 20, 2000

[54] METHOD OF CONTROLLING RECEIVED SIGNAL LEVEL

[75] Inventor: Satoru Kashimura, Tokyo, Japan

[73] Assignee: Oki Electric Industry Co., Ltd., Tokyo, Japan

[21] Appl. No.: 09/050,892

[22] Filed: Mar. 31, 1998

[30] Foreign Application Priority Data

Jul. 8, 1997 [JP] Japan ..................... 9-182301

[51] Int. Cl.⁷ ...................................... H04B 1/06
[52] U.S. Cl. ........................ 455/234.1; 375/345
[58] Field of Search ............... 455/250.1, 232.1, 455/234.1, 234.2, 78, 82, 83, 249.1, 280, 293, 341; 375/345

[56] References Cited

U.S. PATENT DOCUMENTS

| | | | |
|---|---|---|---|
| 3,582,975 | 6/1971 | King .................................... | 326/84 |
| 5,659,582 | 8/1997 | Kojima et al. ...................... | 375/345 |
| 5,722,063 | 2/1998 | Peterzell et al. ................... | 455/287 |
| 5,758,274 | 5/1998 | Vu et al. ............................. | 455/246.1 |
| 5,930,692 | 7/1999 | Peterzell et al. ................... | 455/217 |

*Primary Examiner*—Dwayne D. Bost
*Assistant Examiner*—Sonny Trinh
*Attorney, Agent, or Firm*—Rabin & Champagne, P.C.

[57] ABSTRACT

A wireless communication device has an amplifying element coupled between an antenna and a receiving circuit, for amplifying a signal received by the antenna. A control circuit switches power to the amplifying element on when the received signal strength is comparatively low, and off when the received signal strength is comparatively high. When its power is switched off, the amplifying element attenuates the received signal. The control circuit may also control an antenna switch, causing the antenna switch to couple the received signal to the amplifying element with or without attenuation, depending on the strength of the received signal.

15 Claims, 4 Drawing Sheets

METHOD OF CONTROLLING RECEIVED SIGNAL LEVEL

BACKGROUND OF THE INVENTION

The present invention relates to a method of controlling the received signal level in a wireless communication device such as a portable telephone set.

Portable telephone sets and other mobile wireless communication devices are sometimes brought close to a base station from which they receive a transmitted signal. As a result, the electric field strength at the receiving antenna may become so strong as to saturate an amplifier that amplifies the received signal, in which case the signal cannot be received correctly.

One conventional solution to this problem employs a variable-gain amplifier, and reduces the operating point of the variable-gain amplifier when the received signal strength increases. A problem with this solution is that a variable-gain amplifier is more complex than a fixed-gain amplifier, and requires complex control circuitry. Various control methods have been employed, but they have generally required special integrated circuits that add unwanted increments to the size, weight, and cost of the wireless communication device.

SUMMARY OF THE INVENTION

It is accordingly an object of the present invention to provide a simple method of preventing saturation in the receiving section of a wireless communication device.

The invented wireless communication device has a receiving circuit for processing a signal received from an antenna, an amplifying element coupled between the antenna and the receiving circuit, and a power supply line for supplying power to the amplifying element. A switching element is coupled in series between the power supply line and the amplifying element.

A control circuit switches the switching element on when the received signal strength is less than a first threshold, and switches the switching element off when the received signal strength is greater than a second threshold. When the switching element is switched on, the amplifying element amplifies the received signal, using the power supplied from the power supply line. When the switching element is switched off, the amplifying element attenuates the received signal.

The wireless communication device may also have an antenna switch coupling the antenna switchably to the amplifying element and to a transmitting circuit. The control circuit controls the antenna switch, setting the antenna switch to attenuate the received signal if the received signal strength rises above a certain threshold.

DETAILED DESCRIPTION OF THE INVENTION

Embodiments of the invention will be described with reference to the attached exemplary drawings.

Figure 1:
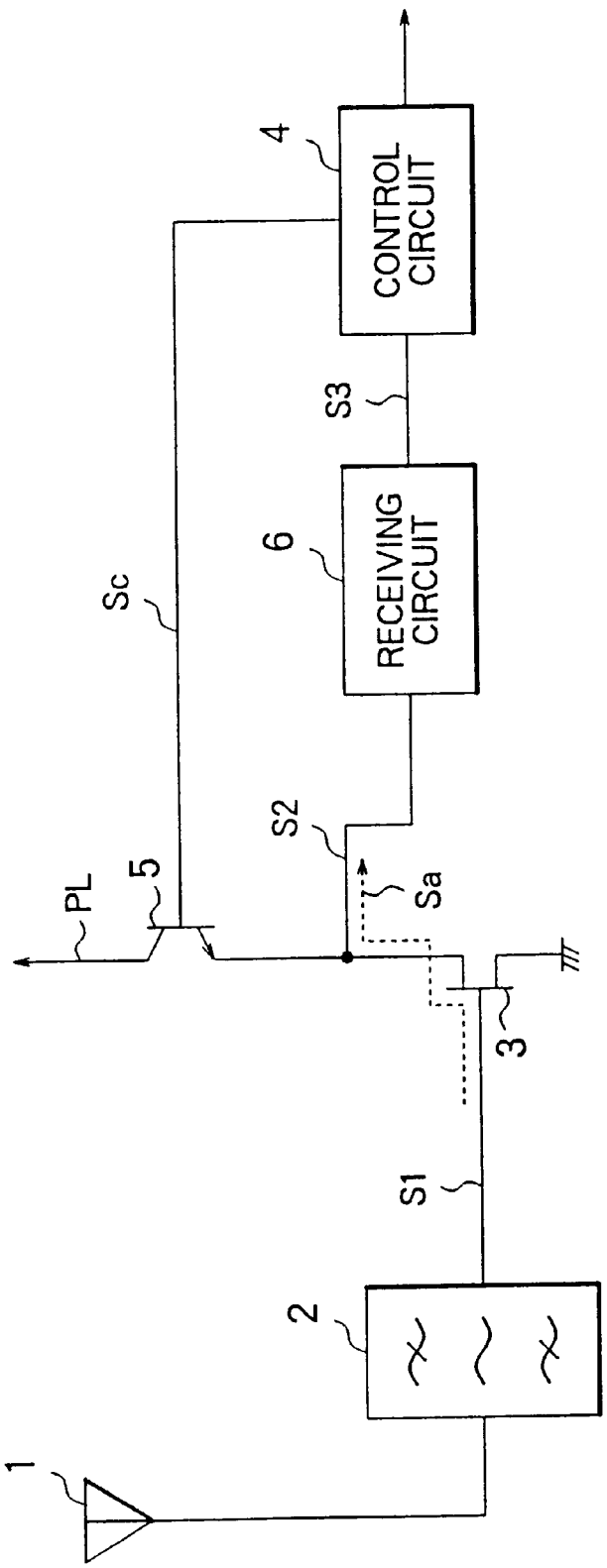
FIG. 1 is a circuit diagram illustrating a first embodiment of the invention.

FIG. 1 shows the relevant parts of a wireless communication device employing a first embodiment of the invention, including an antenna 1, a bandpass filter 2 coupled to the antenna 1, a gallium-arsenide field-effect transistor or GaAs FET 3, a control circuit 4 such as a microprocessor or microcontroller, an npn bipolar transistor 5, and a receiving circuit 6. The FET 3, control circuit 4, npn transistor 5, and receiving circuit 6 are part of the receiving section of the wireless communication device.

The FET 3 functions as an amplifying element, amplifying the received signal S1 obtained from the bandpass filter 2. The FET 3 has source, gate, and drain electrodes, of which the source is coupled to a ground line, the gate is coupled to the bandpass filter 2, and the drain is coupled to the npn transistor 5.

The npn transistor 5, which functions as a switching element, has emitter, base, and collector electrodes. The emitter is coupled to the drain of the FET 3, the base is coupled to the control circuit 4, and the collector is connected to a power supply line PL.

An amplified signal S2 is taken from a point between the drain of the FET 3 and the emitter of the npn transistor 5, and provided to the receiving circuit 6. The receiving circuit 6 processes the amplified signal S2 and produces an analog output signal S3, which is passed to the control circuit 4.

The control circuit 4 has an analog-to-digital converter (not visible) that converts the analog output signal S3 to a digital signal, and logic circuits (not visible) that generate a control signal Sc from the digital signal, responsive to the level of the analog signal S3 as indicated by the digital signal. The control signal Sc is supplied to the base of the npn transistor 5.

The control circuit 4 operates according to two thresholds. When the level of the analog signal S3 is less than the first threshold, the control circuit 4 sets the control signal Sc to a high logic level, switching the npn transistor 5 on so that the npn transistor 5 conducts. When the level of the analog signal S3 is greater than the second threshold, the control circuit 4 sets the control signal Sc to a low logic level, switching the npn transistor 5 off so that the npn transistor 5 does not conduct. When the level of the analog signal S3 is between the first threshold and second threshold, the control circuit 4 leaves the control signal Sc at its existing high or low logic level.

When switched on, the npn transistor 5 allows current to flow from the power supply line PL through the FET 3 to ground, regulated by the voltage at the gate of the FET 3. With the npn transistor 5 acting as a load, the FET 3 amplifies small changes in the received signal S1 into larger changes in the amplified signal S2.

When switched off, the npn transistor 5 cuts off the flow of power supply current through the FET 3. The FET 3 now becomes an isolating element, but the isolation is imperfect. Due to capacitive coupling between the gate and drain, for example, an attenuated signal Sa leaks through the FET 3 to the receiving circuit 6, as indicated by the dotted line.

Figure 2:
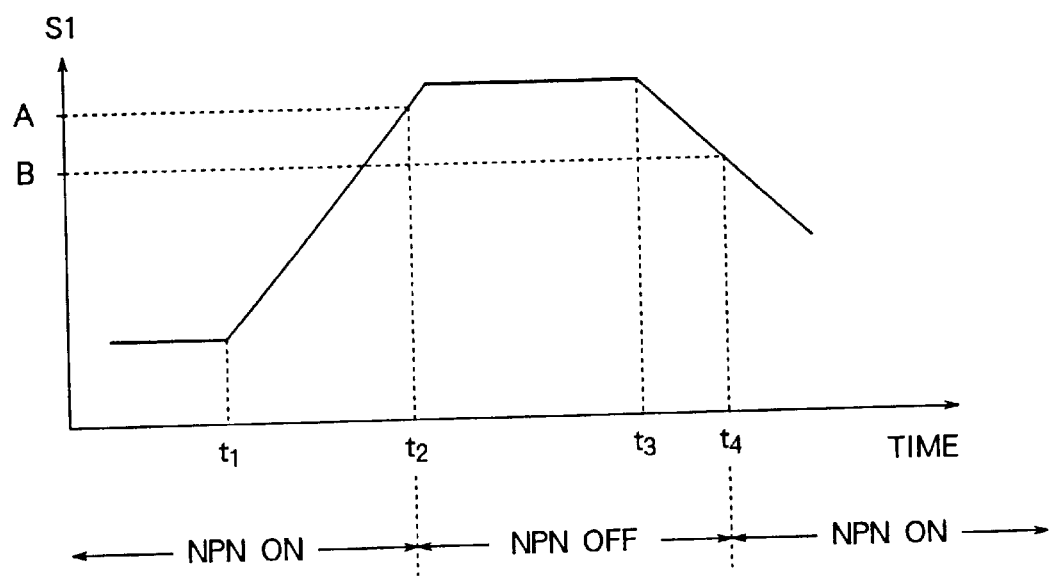
FIG. 2 illustrates control of the received signal level in the first embodiment.

FIG. 2 illustrates the operation of the first embodiment. The horizontal axis represents time. The vertical axis represents the power level of the received signal S1.

The wireless communication device is originally at a distance from the transmitting base station such that the received signal S1 is not too strong. The control signal Sc is high, the npn transistor 5 is switched on, the FET 3 amplifies the received signal S1 in a linear manner, and the receiving circuit 6 also operates in a linear manner on the amplified signal S2.

At time $t_1$, the wireless communication device begins to approach the base station, and the power of the received signal S1 begins to rise. At time $t_2$, the power reaches a level A corresponding to the second threshold of the control circuit 4, which accordingly sets the control signal Sc to the low logic level, switching off the npn transistor 5. The receiving circuit 6 no longer receives an amplified signal S2, but operates on the attenuated signal Sa. Since the power level of the received signal S1 was high to begin with, the power level of the attenuated signal Sa is sufficiently high for the attenuated signal Sa to be correctly processed by the receiving circuit 6.

At time $t_3$, the wireless communication device begins moving away from the base station, and the power level of the received signal S1 begins to fall. At time $t_4$, the received signal S1 reaches a level B corresponding to the first threshold of the control circuit 4, which accordingly sets the control signal Sc to the high logic level, switching the npn transistor 5 on. The receiving circuit 6 now receives the amplified signal S1 again.

The threshold levels are set so that the npn transistor 5 is switched off before the received signal S1 reaches a level that would saturate the FET 3, and before the amplified signal S2 reaches a level that would saturate the receiving circuit 6. The necessary control logic in the control circuit 4 does not add significantly to the size, weight, or cost of the wireless communication device. If the control circuit is a microprocessor or microcontroller executing a stored control program, the control signal Sc can be controlled by a simple program routine involving just a few instructions.

Figure 3:
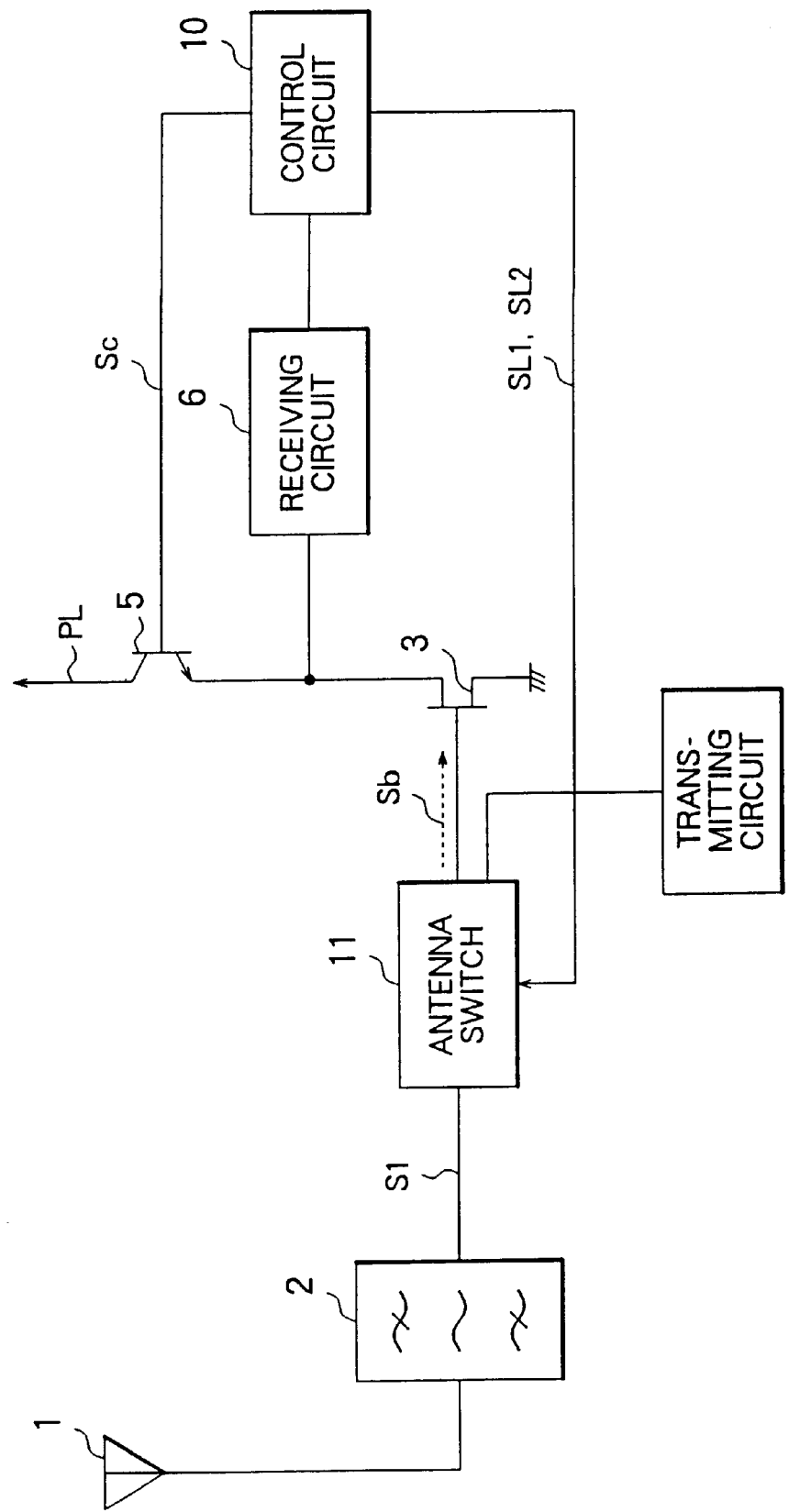
FIG. 3 is a circuit diagram illustrating a second embodiment of the invention.

FIG. 3 illustrates a second embodiment of the invention, using the same reference numerals as in FIG. 1 to denote the antenna 1, bandpass filter 2, GaAs FET 3, npn bipolar transistor 5, and receiving circuit 6. These elements function as in the first embodiment. The second embodiment has a control circuit 10 that differs from the control circuit of the first embodiment. FIG. 3 also shows an antenna switch 11 and a transmitting circuit 12, which were omitted from FIG. 1.

The control circuit 10 generates a control signal Sc, which is supplied to the gate of the npn transistor 5 as in the first embodiment, and also generates a pair of selection signals SL1 and SL2, which are supplied to the antenna switch 11.

Figure 4:
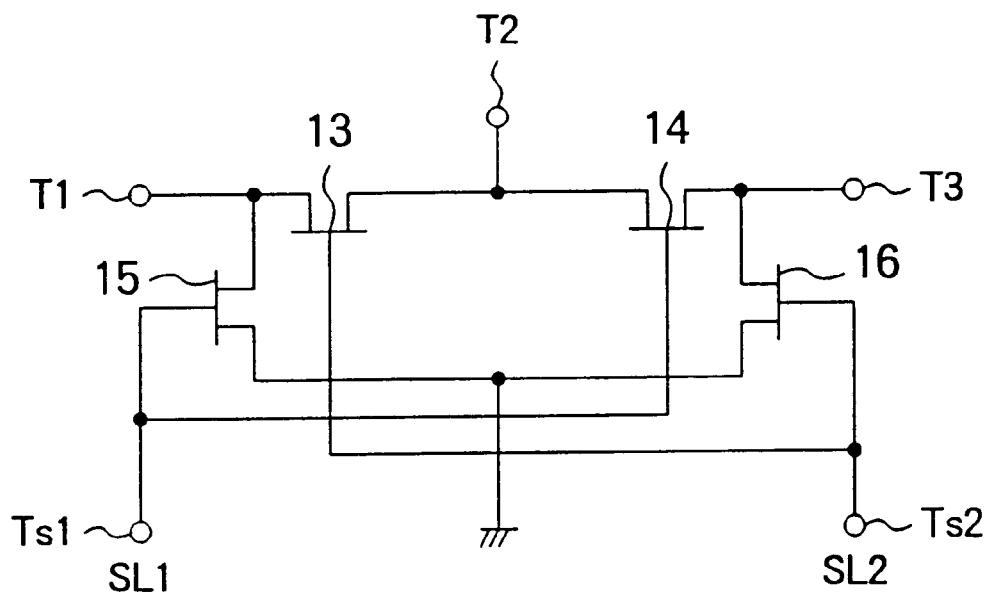
FIG. 4 is a circuit diagram of the antenna switch in the second embodiment.

Referring to FIG. 4, the antenna switch 11 has a first terminal T1 coupled to the transmitting circuit 12, a second terminal T2 coupled to the bandpass filter 2, a third terminal T3 coupled to the FET amplifying element 3, and selection terminals Ts1 and Ts2 that receive selection signals SL1 and SL2, respectively. A p-channel FET 13 is coupled in series between terminals T1 and T2. Another p-channel FET 14 is coupled in series between terminals T2 and T3. Yet another p-channel FET 15 is coupled in series between terminal T1 and ground. Still another p-channel FET 16 is coupled in series between terminal T3 and ground. Selection signal SL1 is supplied to the gates of FETs 14 and 15. Selection signal SL2 is supplied to the gates of FETs 13 and 16. The FETs 13, 14, 15, and 16 operate as switching elements.

When the wireless communication device is transmitting, the control circuit 10 sets selection signal SL1 to the high logic level and selection signal SL2 to the low logic level, so that FETs 13 and 16 are switched on and FETs 14 and 15 are switched off. The bandpass filter 2 is accordingly coupled to the transmitting circuit 12 through FET 13, while the terminal T3 coupled to the receiving section is grounded through FET 16.

In a first or normal receiving mode, the control circuit 10 sets selection SL1 to the low logic level, selection signal SL2 to the high logic level, and control signal Sc to the high logic level. In the antenna switch 11, FETs 13 and 16 are switched off and FETs 14 and 15 are switched on. The bandpass filter 2 is coupled to the FET amplifying element 3 through FET 14, while the terminal T1 coupled to the transmitting circuit 12 is grounded through FET 15. The received signal S1 passes through the antenna switch 11 substantially without attenuation, and is amplified by FET 3 as in the first embodiment.

In a second receiving mode, the control circuit 10 sets selection signal SL1 to the high logic level, selection signal SL2 to the low logic level, and control signal Sc to the high logic level. FET 14 is switched off, so the bandpass filter 2 is isolated from the receiving section, but the isolation is imperfect. An attenuated signal Sb leaks through FET 14 from the bandpass filter 2 to the receiving section. The attenuated signal Sb is amplified by the FET amplifying element 3, and the amplified signal is provided to the receiving circuit 6.

In a third receiving mode, the control circuit 10 sets selection signal SL1 to the high logic level, selection signal SL2 to the low logic level, and control signal Sc to the low logic level, switching off the npn transistor 5 and causing the FET 3 to act as an isolating element instead of an amplifying element. The received signal S1 is now attenuated by both the antenna switch 11 and FET 3 before being processed by the receiving circuit 6.

The control circuit 4 selects these modes according to threshold values as in the first embodiment, setting the control signal Sc high when the received signal strength falls below a first threshold, setting the control signal Sc low when the received signal strength rises above a second threshold, setting selection signal SL1 low when the received signal strength falls below a third threshold, and setting the selection signal SL1 high when the received signal strength rises above a fourth threshold. The third threshold is lower than the fourth threshold, which is lower than the first threshold.

In the third receiving mode, attenuation by both the antenna switch 11 and FET 3 enables the wireless communication device to operate in very close proximity to the base station, where the received electric field strength is extremely high.

The control logic in the second embodiment is only slightly more complex than in the first embodiment. Like the first embodiment, the second embodiment does not require special integrated circuits, and does not add significantly to the size, weight, or cost of the wireless communication device.

As described above, the second embodiment provides two levels of attenuation, but the control circuit 10 can also set selection signal SL1 to the low logic level, selection signal SL2 to the high logic level, and control signal Sc to the low logic level to provide a third level of attenuation, in which the received signal S1 is attenuated by FET 3, without being attenuated in the antenna switch 11.

The invention is not limited to the embodiments described above. For example, the received signal strength can be detected at a point other than the output of the receiving circuit 6. The control signal Sc can be generated in response to a manual operation by the user, instead of by a control circuit. The amplifying element does not have to be a GaAs FET; other types of amplifying elements can be used, as long as the amplifying element provides a suitable attenuation of the received signal when the power supply of the amplifying element is cut off.

In the second embodiment, the antenna switch can have various internal configurations other than the configuration shown in FIG. 4, as long as the antenna switch provides a suitable attenuation of the received signal when the antenna switch is not set to a state that isolates the bandpass filter from the amplifying element. In the configuration shown, the second selection signal SL2 can be left at the high logic level in the second and third receiving modes, so that the bandpass filter is isolated from both the transmitting and receiving circuits.

Those skilled in the art will recognize that further variations are possible within the scope claimed below.

What is claimed is:

1. A method of controlling a received signal level in a wireless communication device having an antenna, a power supply line, a receiving circuit, an amplifying element coupled between the antenna and the receiving circuit, a transmitting circuit, and an antenna switch, the antenna being switchably coupled through the antenna switch to the amplifying element and to the transmitting circuit, the method comprising the steps of:

detecting strength of a received signal received by the antenna;

supplying current from the power supply line to the amplifying element when the strength of the received signal is less than a first threshold, causing the amplifying element to amplify the received signal; and cutting off current from the power supply line to the amplifying element when the strength of the received signal is greater than a second threshold, causing the amplifying element to attenuate the received signal;

setting the antenna switch to a first state, when the strength of the received signal is less than a third threshold, causing the antenna switch to couple the received signal from the antenna to the amplifying element without attenuation; and setting the antenna switch to a second state, when the strength of the received signal is greater that a fourth threshold, causing the antenna switch to couple the received signal from the antenna to the amplifying element with attenuation.

2. The method of claim 1, wherein the amplifying element is a field-effect transistor.

3. The method of claim 1, wherein said steps of supplying current and cutting off current are carried out by controlling a bipolar transistor coupled in series between the power supply line and the amplifying element.

4. The method of claim 1, wherein the second threshold is higher than the first threshold.

5. The method of claim 4, further comprising the steps of:

continuing to supply current from the power supply line to the amplifying element, when the strength of the received signal changes from a value less than the first threshold to a value greater than the first threshold but less than the second threshold; and continuing to cut off current from the power supply line to the amplifying element, when the strength of the received signal changes from a value greater than the second threshold to a value less than the second threshold but greater than the first threshold.

6. The method of claim 1, wherein the fourth threshold is less than the first threshold.

7. The method of claim 1, wherein the antenna switch comprises a field-effect transistor coupled in series between the antenna and the amplifying element.

8. The method of claim 1, wherein said step of supplying current and said step of cutting off current are combined with said step of setting the antenna switch to a first state and said step of setting the antenna switch to a second state, causing the wireless communication device to operate in at least a first mode in which the received signal is not attenuated, a second mode in which the received signal is attenuated by just one of the antenna switch and the amplifying element, and a third mode in which the received signal is attenuated by both the antenna switch and the amplifying element.

9. A wireless communication device having an antenna, a receiving circuit for processing a received signal received from the antenna, an amplifying element coupled between the antenna and the receiving circuit, and a power supply line for supplying power to the amplifying element, comprising:

a switching element coupled in series between said power supply line and said amplifying element;

a control circuit coupled to said switching element, for detecting strength of the received signal, switching said switching element on when the strength of the received signal is less than a first threshold, thereby causing said amplifying element to amplify the received signal, and switching said switching element off when the strength of the received signal is greater than a second threshold, thereby causing said amplifying element to attenuate the received signal;

a transmitting circuit; and an antenna switch controlled by said control circuit, switchably coupling said antenna to said amplifying element and said transmitting circuit, said antenna switch being settable by said control circuit to a first state in which said antenna switch couples the received signal to said amplifying element without attenuation, and to a second state in which said antenna switch couples the received signal to said amplifying element with attenuation.

10. The wireless communication device of claim 9, wherein said amplifying element is a field-effect transistor.

11. The wireless communication device of claim 9, wherein said switching element is a bipolar transistor.

12. The wireless communication device of claim 9, wherein the second threshold is higher than the first threshold.

13. The wireless communication device of claim 12, wherein said control circuit leaves said switching element switched on when the strength of the received signal changes from a value less than the first threshold to a value greater than the first threshold but less than the second threshold, and leaves said switching element switched off when the strength of the received signal changes from a value greater than the second threshold to a value less than the second threshold but greater than the first threshold.

14. The wireless communication device of claim 9, wherein said antenna switch comprises a field-effect transistor coupled in series between said antenna and said amplifying element.

15. The wireless communication device of claim 9, wherein said control circuit causes said wireless communication device to operate in at least a first mode in which the received signal is not attenuated, a second mode in which the received signal is attenuated by just one of said antenna switch and said amplifying element, and a third mode in which the received signal is attenuated by both said antenna switch and said amplifying element.

* * * * *